United States Patent
Naffziger

(10) Patent No.: US 6,772,277 B2
(45) Date of Patent: *Aug. 3, 2004

(54) METHOD OF WRITING TO A MEMORY ARRAY USING CLEAR ENABLE AND COLUMN CLEAR SIGNALS

(75) Inventor: Samuel D. Naffziger, Ft. Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 256 days.

This patent is subject to a terminal disclaimer.

(21) Appl. No.: 09/845,387

(22) Filed: Apr. 30, 2001

(65) Prior Publication Data

US 2002/0161964 A1 Oct. 31, 2002

(51) Int. Cl.[7] .................. G06F 13/00; G11C 11/419
(52) U.S. Cl. ................. 711/104; 711/166; 365/218; 365/230.05
(58) Field of Search ................. 711/104, 105, 711/166; 365/154, 156, 218, 230.05

(56) References Cited

U.S. PATENT DOCUMENTS

| | | | | |
|---|---|---|---|---|
| 4,489,404 A | * | 12/1984 | Yasuoka | 365/218 |
| 4,768,172 A | * | 8/1988 | Sasaki | 365/154 |
| 4,789,967 A | * | 12/1988 | Liou et al. | 365/230.03 |
| 4,858,182 A | * | 8/1989 | Pang et al. | 365/218 |
| 4,890,263 A | * | 12/1989 | Little | 365/218 |
| 4,928,266 A | * | 5/1990 | Abbott et al. | 365/154 |
| 5,235,543 A | * | 8/1993 | Rosen | 365/154 |
| 5,285,420 A | * | 2/1994 | Shibue | 365/218 |
| 5,450,353 A | * | 9/1995 | Koike | 365/154 |
| 5,710,742 A | * | 1/1998 | Carter et al. | 365/230.05 |
| 5,742,557 A | * | 4/1998 | Gibbins et al. | 365/230.05 |
| 6,014,732 A | * | 1/2000 | Naffziger | 711/203 |
| 6,108,232 A | * | 8/2000 | Hennebois et al. | 365/154 |
| 6,301,186 B1 | * | 10/2001 | Naffziger | 365/230.05 |

FOREIGN PATENT DOCUMENTS

| | | | |
|---|---|---|---|
| EP | 0430101 | | 6/1991 |
| EP | 0517260 | | 12/1992 |
| EP | 0594266 | * | 4/1994 |
| EP | 0898281 | | 2/1999 |
| JP | 02-089288 | * | 3/1990 |
| JP | 02-121190 | * | 5/1990 |
| JP | 04-360095 | * | 12/1992 |

OTHER PUBLICATIONS

Translation of JP 02–121190, contracted by USPTO, document No. PTO 03–5096 (original Japanese document published May 9, 1990).*

IBM Technical Disclousre Bulletin, vol. 25, No. 12 May 1983 (US) Chao, H.H., "Array Arrangement and Layout of Taper Isolated Dynamic Gain RAM Cell" pp. 6387 to 6390, especially p. 6390.

* cited by examiner

*Primary Examiner*—Glenn Gossage
(74) *Attorney, Agent, or Firm*—Alexander J. Neudeck

(57) ABSTRACT

A method of operating a static random access memory (SRAM) having a column clear function by performing write operations using a two step process. To perform a write, each cell in a row to be written is preset during a first step. Then, each cell that is to have a zero written to it is cleared using a column clear operation. A column of cells may be cleared by enabling all the rows for clearing, then asserting column clear control signals for each of the columns in the array to be cleared. A subset of columns of a plurality of rows may be cleared by asserting a plurality of column clear signals corresponding to the subset of columns and a plurality of work lines corresponding to the plurality of rows.

10 Claims, 3 Drawing Sheets

METHOD OF WRITING TO A MEMORY ARRAY USING CLEAR ENABLE AND COLUMN CLEAR SIGNALS

FIELD OF THE INVENTION

The present invention relates generally to integrated circuits, and more particularly, to techniques and circuits for storing data in a static random access memory.

BACKGROUND OF THE INVENTION

Static random access memory (SRAM) is used in many electronic systems to store digital data without the need for periodic refresh. For example, the cache memory of many computer systems is made up of SRAM. A typical SRAM cell fabricated in a metal-oxide-semiconductor (MOS) process with one read/write port is often made from six transistors—four transistors to hold the data and two transistors per read/write port used as access devices. The access devices are typically controlled by "word lines" running in a first direction (for example, across a row or the horizontal direction when viewed oriented a certain way) and would dump/take data from "bit lines" running in another direction (for example, along a column or the vertical direction when viewed as described above). Therefore, a typical SRAM cell requires one word line running in the horizontal direction per row of SRAM cells and two bit lines running in the vertical direction per column of SRAM cells.

Some specialized applications, however, require an SRAM cell to have functionality in addition to a single read/write port. One such specialized application involves the storage of "physical hit vectors" as described in U.S. Pat. No. 6,014,732 granted to Naffziger which is hereby incorporated herein by reference. This application needs two read/write ports and the ability to clear an entire column of SRAM cells.

The addition of another read/write port and the ability to clear an entire column increases the number of word lines running horizontally and the number of bit lines running vertically. In particular, two additional bit lines running vertically for the second read/write port and a "clear" line also running vertically would be needed for each column of SRAM cells. Likewise, an additional word line would have to run horizontally across each row of SRAM cells. This brings the total number of lines running vertically over a given SRAM cell to five and the total number of lines running horizontally to two for a total of seven lines running across each SRAM cell.

This number of lines, especially lines running in the vertical direction, tends to grow the size of the SRAM cell significantly and reduce its frequency of operation. Accordingly, there is a need in the art for a two-ported SRAM cell with a column clear function that has fewer that five vertical lines and fewer that seven total lines across the cell.

SUMMARY OF THE INVENTION

The present invention provides an SRAM cell and array that has a column clear function with only three vertical lines and six total lines across a cell and a method of operating that cell and array of those cells. Instead of two bit lines per port and two access devices per port as in a traditional SRAM cell, one bit line and one access device per port are used. In addition, one additional bit line, one additional word line, and two devices in series are used to perform the column clear operation and complete a write operation.

The cell is operated by performing write operations using a two step process. To perform a write, each cell in a row to be written is preset during a first step. Then, each cell that is to have a zero written to it is cleared using the additional bit line and additional word line to address the cells to be cleared. A column of cells may be cleared by enabling all the rows for clearing, then asserting column clear control signals for each of the columns in the array to be cleared.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENTS

Figure 1:
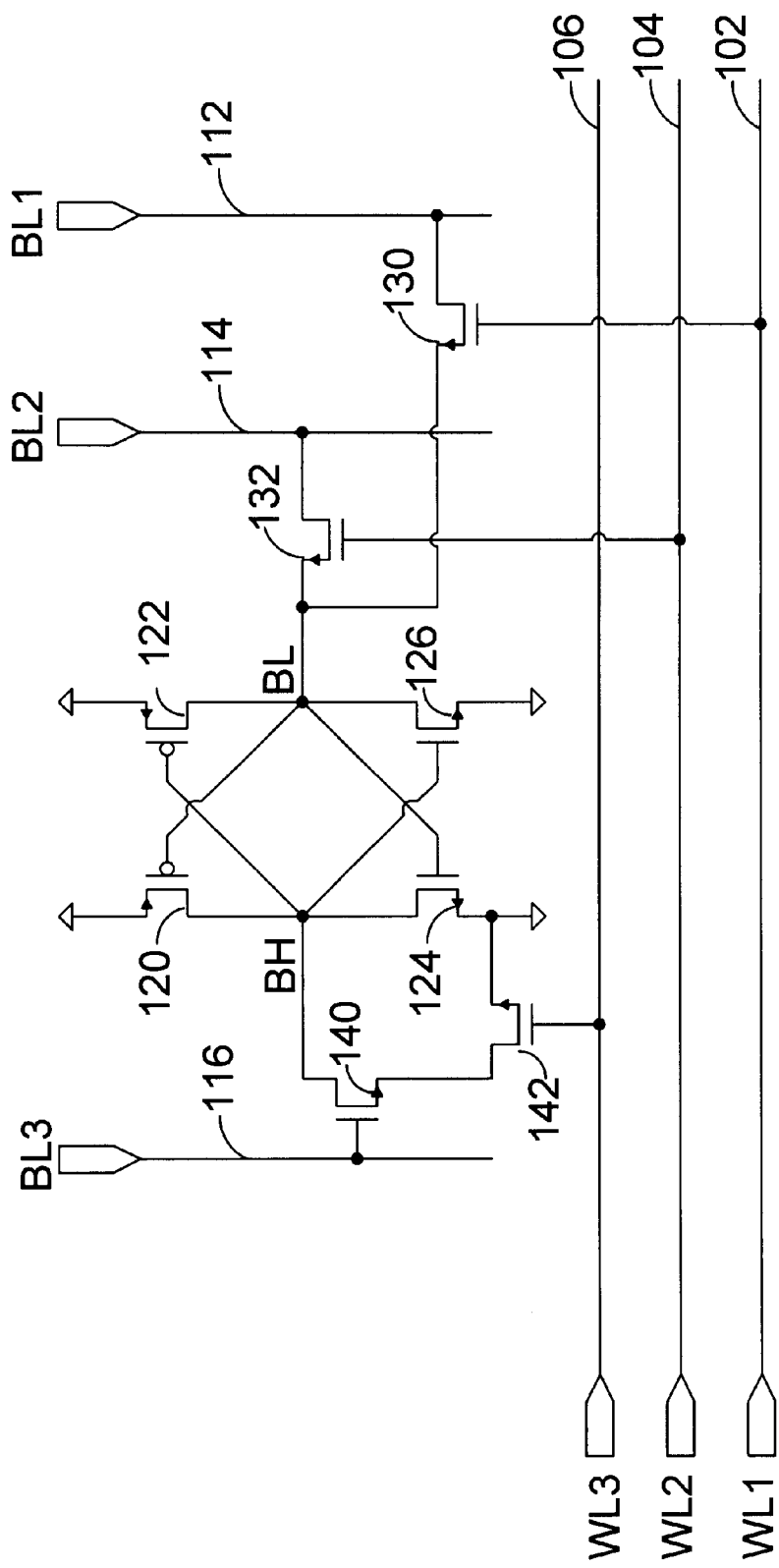
FIG. 1 is a schematic illustration of an SRAM with column clear functionality having six total lines across it.

FIG. 1 is a schematic illustration of an SRAM with column clear functionality having six total lines across it. In FIG. 1, first, second, and third word lines WL1 102, WL2 104, WL3 106, respectively, run across the cell in a first direction. For illustration purposes, this first direction will be hereinafter referred to as the horizontal direction. A first, second, and third bit lines BL1 112, BL2 114, BL3 116, respectively, run across the cell in a second direction. For illustration purposes, this second direction will be hereinafter referred to as the vertical direction. Also, when the SPAN cells of FIG. 1 are placed in a two dimensional array, the cells adjacent to each other in the horizontal direction will be referred to as being in a row and the cells adjacent to each other in the vertical direction will be referred to as being in a column. Finally, note that the total number of lines crossing the cell is six and the total number in the vertical direction is three. This compares favorably with the seven total and five vertical lines that a traditional two-port cell with column clear needs.

P-channel field effect transistors (PFETs) 120 and 122 and N-channel field effect transistors (NFETs) 124 and 126 form a pair of cross-coupled complementary metal oxide semiconductor (CMOS) inverters that act as a memory element of the SRAM cell shown in FIG. 1. This is for illustrative purposes only. Other types of memory elements could be used as well. For example, the invention could be used with cross-coupled N-channel metal-oxide semiconductor (NMOS) inverters, a flip-flop formed from NAND or NOR gates, or other types of memory elements using different technologies such as magnetic random access memory cells (MRAM cells)

A first of the cross-coupled inverters is formed by PFET 120 and NFET 124. The input to this inverter is node BL and the output is node BR. The source of PFET 120 is connected to the positive supply voltage. The drain of PFET 120 is connected to node BR which is connected to the gate of PFET 122, the gate of NFET 126, the drain of NFET 124, and the drain of NFET 140. The source of NFET 124 is connected to the negative supply voltage. The gates of both PFET 120 and NFET 124 are connected to the drains of PFET 122 and NFET 126.

A second of the cross-coupled inverters is formed by PFET 122 and NFET 126. The input to this inverter is node BH and the output is node BL. The source of PFET 122 is connected to the positive supply voltage. The drain of PEET 122 is connected to node BL which is connected to the gate of PFET 120, the gate of NFET 124, the drain of NFET 126, and the sources of NFETs 130 and 132. The source of NFET 126 is connected to the negative supply voltage. The gates of both PFET 122 and NFET 126 are connected to the drains of PFET 120 and NPET 124.

NFET 130 is a first access device. The gate of NFET 130 is connected to word line WL1 102. The drain of NFET 130 is connected to bit line BL1 112. NFET 132 is a second access device. The gate of NFET 132 is connected to word line WL2 104. The drain of NFET 132 is connected to bit line BL2 114.

NFETs 140 and 142 form column clear logic that provides the capability to clear the cell when properly addressed by row and column. The gate of NFET 140 is connected to bit line BL3 116. The source of NFET 140 is connected to the drain of NFET 142. The gate of NFET 142 is connected to word line WL3 106. The source of NFET 142 is connected to the negative supply voltage.

To read the cell shown in FIG. 1, either, or both bit lines 112 and 114 are precharged and the precharging device turned off so that bit lines 112 or 114 are floating at a precharge level. Then, when word line 102 and/or word line 104 is/are pulled high, one or both of access devices 130 and 132 is/are turned on, respectively. This allows the value stored by the memory element as output on node BL to charge or discharge bit lines 112 or 114. Bit lines 112 and 114 are charged or discharged depending upon the precharge level and the value on node BL. For example, if bit line 112 was precharged to the positive supply voltage and the memory element was driving BL low (i.e. at or near the negative supply voltage level), then bit line 112 would be discharged through access device 132 and NFET 126 of the memory element. The lowered voltage level of bit line 112 could then be read by a sense amplifier on bit line 112. Another example is if bit line 112 was precharged to an intermediate value (i.e. not near the positive or the negative supply voltage levels) and the memory element was driving BL to a high (i.e. at or near the positive supply voltage level). In this case, bit line 112 would be charged through access device 132 and PEET 122 of the memory element. This raised voltage level on bit line 112 could then be read by a sense amplifier on bit line 112. Note that since there are two access devices 130, 132 and two bit lines 112, 114 two reads can be accomplished simultaneously either from the same or different rows.

Figure 2:
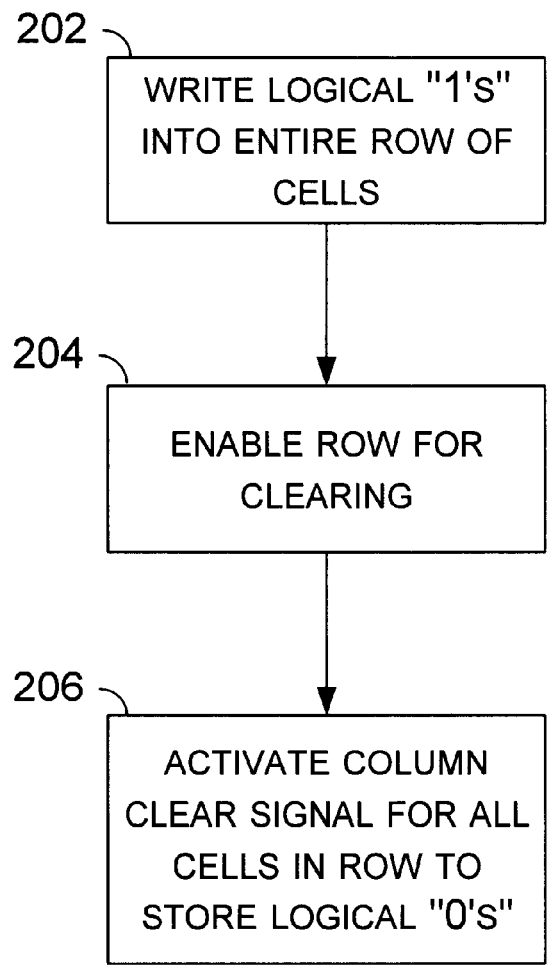
FIG. 2 is a flowchart illustrating a method of writing data into a row of the SRAM cells shown in FIG. 1.

A process for writing to a row of SRAM cells shown in FIG. 1 is illustrated by a flowchart shown in FIG. 2. In a step 202 logical 1's are written into the entire row of cells that is being written. This is done by driving all the bit lines BL1 112 for the row low while the word line WL1 102 is active. This causes the memory element to hold a logical 0 on BL and a logical 1 on BR. Note that for the cell shown in FIG. 1, word lines WL1 102, WL2 104, WL3 106, and bit line BL3 116 are active when they are driven high (i.e. driven towards the positive supply voltage)

In a step 204, the row is enabled for clearing. This is done by activating WL3 106. To prevent a drive fight, when WL3 106 is activated, WL1 102 and WL2 104 should be deactivated.

In a step 206, the column clear signals for all cells in the row that are to store logical 0's are activated. This is done by activating BL3 116 for the columns corresponding to each cell in the row that is to store a logical 0. Accordingly, this causes the memory element for those cells to hold a logical 1 on BL and a logical 0 on BH.

Figure 3:
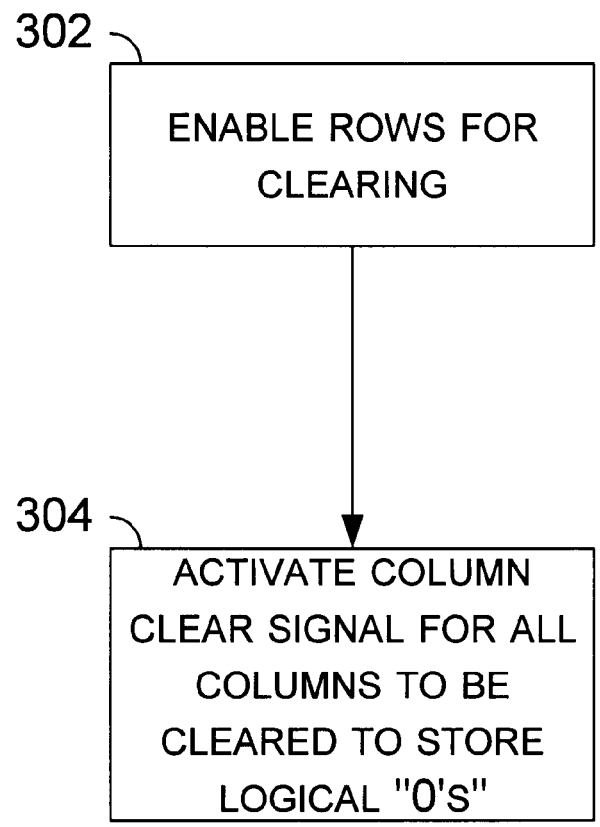
FIG. 3 is a flowchart illustrating a method of clearing at least one column of SRAM cells shown in FIG. 1.

A process for clearing a column of SRAM cells shown in FIG. 1 is illustrated by a flowchart shown in FIG. 3. In a step 302, all of the rows in the SRAM to be cleared are enabled for clearing. This is done by activating WL3 for all of the rows to be cleared. To clear an entire column, WL3 for all of the rows would need to be activated. To clear columns in only a subset of rows, then a subset of WL3 lines in the array would need to be activated.

In a step 304, the column clear signal is activated for the columns that are to be cleared. This is done by activating BL3 116 for the one or more columns to be cleared.

Although a specific embodiment of the invention has been described and illustrated, the invention is not to be limited to the specific form or arrangement of the parts so described and illustrated. The invention is limited only by the claims.

What is claimed is:

1. A method comprising:
    writing data to a random access memory array (RAM) by:
        presetting every cell of a first row of a plurality of RAM cells in said RAM array to a first logic value; and,
        clearing a subset of said every cell of said first row to a second logic value by asserting at least one of a plurality of column clear signals corresponding with said subset while a first clear enable signal is active for said first row of said plurality of RAM cells, wherein said clearing is performed subsequent to said presetting.

2. The method of claim 1, said writing data further comprising:
    asserting a second clear enable signal for a second row of a plurality of RAM cells.

3. The method of claim 1 wherein asserting said at least one of said plurality of column clear signals while said first clear enable signal is active stores said second logic value in each cell of said row of said plurality of RAM cells that has an asserted column clear signal.

4. A method comprising:
    writing data to a plurality of memory elements by:
        presetting all the members of a row of an array of memory elements to a first logic state by enabling said row to respond to bit line signals and asserting a plurality of bit lines, said array of memory elements arranged into rows and columns;
        enabling said row to respond to column clear signals; and,
        clearing a subset of said row of an array of memory elements to a second logic state by asserting a plurality of column clear signals, wherein said enabling and said clearing are performed subsequent to said presetting.

5. The method of claim 4, said writing data further comprising:
    enabling a plurality of rows to respond to said column clear signals.

6. The method of claim 5, said writing data further comprising:
    clearing a subset of columns of said plurality of rows to said second logic state by asserting a plurality of column clear signals.

7. A method comprising:
    writing data to an array of memory cells arranged into rows and columns by:

driving data lines for each column of said array of memory cells to a first logic value;

asserting a first enable line for a row of said array of memory cells thereby storing said first logic value into each of a plurality of memory cells in said row of said array of memory cells; asserting a second enable line for said row of said array of memory cells; and, asserting at least one column clear line for a column of said array of memory cells thereby storing a second logic value into at least one of said plurality of memory cells in said row of said array of memory cells, wherein said asserting said at least one column clear line is performed subsequent to said asserting said first enable line.

8. The method of claim 7, said writing data further comprising:

asserting a third enable line for a second row of said array of memory cells thereby storing said first logic value into each of a second plurality of memory cells in said second row of said array of memory cells; and, asserting a fourth enable line for said second row of said array of memory cells.

9. The method of claim 8 whereby said step of asserting at least one column clear line for a column of said array of memory cells thereby stores said second logic value into at least one of said second plurality of memory cells in said second row of said array of memory cells.

10. A method comprising:

writing to an array of memory cells, said array being arranged into rows and columns of memory cells, by:

writing a first logic state into all of the cells of a selected row, wherein said writing uses an access device; and next clearing at least one of said cells of said selected row to a second logic state, wherein said clearing uses an enable line for said selected row and a clear line for each of at least one column corresponding to said at least one of said cells.

* * * * *